(12) United States Patent
Nam et al.

(10) Patent No.: US 8,898,889 B2
(45) Date of Patent: Dec. 2, 2014

(54) CHUCK ASSEMBLY FOR PLASMA PROCESSING

(75) Inventors: Sang Ki Nam, Fremont, CA (US);
Rajinder Dhindsa, Fremont, CA (US);
Alexei Marakhtanov, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 174 days.

(21) Appl. No.: 13/419,369

(22) Filed: Mar. 13, 2012

(65) Prior Publication Data

US 2013/0127124 A1 May 23, 2013

Related U.S. Application Data

(60) Provisional application No. 61/563,514, filed on Nov. 23, 2011, provisional application No. 61/563,021, filed on Nov. 22, 2011.

(51) Int. Cl.
*B23P 19/00* (2006.01)
*H01J 37/32* (2006.01)
*H01L 21/683* (2006.01)

(52) U.S. Cl.
CPC ..... *H01J 37/32577* (2013.01); *H01J 37/32715* (2013.01); *H01L 21/6831* (2013.01)
USPC ............. 29/740; 204/298.02; 204/298.05; 361/233

(58) Field of Classification Search
USPC ............ 29/740; 204/298.02, 298.05; 361/233
See application file for complete search history.

(56) References Cited

U.S. PATENT DOCUMENTS

| | | | |
|---|---|---|---|
| 4,340,462 A | 7/1982 | Koch | |
| 5,183,990 A | 2/1993 | Enyedy | |
| 5,349,271 A | 9/1994 | Van Os et al. | |
| 5,620,524 A | 4/1997 | Fan et al. | |
| 5,998,933 A | 12/1999 | Shun'ko | |
| 6,023,405 A * | 2/2000 | Shamouilian et al. | ........ 361/234 |
| 6,150,628 A | 11/2000 | Smith et al. | |
| 6,335,293 B1 | 1/2002 | Luo et al. | |

(Continued)

FOREIGN PATENT DOCUMENTS

| | | |
|---|---|---|
| EP | 1 155 164 B1 | 7/2010 |
| JP | 5166595 | 7/1993 |

(Continued)

OTHER PUBLICATIONS

PCT International Search Report—PCT/US2012/065333—(dated Jan. 28, 2013) (3 pages).

(Continued)

*Primary Examiner* — Carl Arbes
(74) *Attorney, Agent, or Firm* — Martine Penilla Group, LLP

(57) ABSTRACT

Systems and methods are presented for a peripheral RF feed and symmetric RF return for symmetric RF delivery. According to one embodiment, a chuck assembly for plasma processing is provided. The chuck assembly includes an electrostatic chuck having a substrate support surface on a first side, a facility plate coupled to the electrostatic chuck on a second side that is opposite the substrate support surface, a peripheral RF feed configured to deliver RF power, the peripheral RF feed having a first portion contacting a periphery of the facility plate and an RF strap coupling the peripheral RF feed to an RF source.

16 Claims, 16 Drawing Sheets

(56) References Cited

U.S. PATENT DOCUMENTS

| | | | |
|---|---|---|---|
| 6,337,460 B2 | 1/2002 | Kelkar et al. | |
| 6,392,351 B1 | 5/2002 | Shun'ko | |
| 6,432,260 B1 | 8/2002 | Mahoney et al. | |
| 6,494,958 B1 | 12/2002 | Shamouilian et al. | |
| 6,527,911 B1 | 3/2003 | Yen et al. | |
| 6,557,248 B1* | 5/2003 | Shamouilian et al. | 29/825 |
| 6,825,618 B2 | 11/2004 | Pu et al. | |
| 6,855,906 B2 | 2/2005 | Brailove | |
| 6,872,259 B2 | 3/2005 | Strang | |
| 6,924,455 B1 | 8/2005 | Chen et al. | |
| 7,363,876 B2 | 4/2008 | Lai et al. | |
| 8,056,503 B2 | 11/2011 | Kikuchi et al. | |
| 8,485,128 B2* | 7/2013 | Kellogg et al. | 118/723 I |
| 2001/0000104 A1 | 4/2001 | Li et al. | |
| 2001/0002582 A1 | 6/2001 | Dunham et al. | |
| 2001/0047760 A1 | 12/2001 | Moslehi | |
| 2002/0170881 A1 | 11/2002 | Benzing et al. | |
| 2003/0015965 A1 | 1/2003 | Godyak | |
| 2003/0071035 A1 | 4/2003 | Brailove | |
| 2003/0188685 A1 | 10/2003 | Wang et al. | |
| 2004/0027781 A1 | 2/2004 | Hanawa et al. | |
| 2004/0047720 A1 | 3/2004 | Lerner et al. | |
| 2004/0175953 A1 | 9/2004 | Ogle | |
| 2005/0000655 A1 | 1/2005 | Wi | |
| 2005/0001556 A1 | 1/2005 | Hoffman et al. | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2006/0060302 A1 | 3/2006 | White et al. | |
| 2006/0065623 A1 | 3/2006 | Guiney et al. | |
| 2006/0075969 A1 | 4/2006 | Fischer | |
| 2007/0081295 A1 | 4/2007 | Brillhart et al. | |
| 2007/0251642 A1 | 11/2007 | Bera et al. | |
| 2008/0020574 A1 | 1/2008 | Marakhtanov et al. | |
| 2008/0041820 A1 | 2/2008 | Tong et al. | |
| 2008/0173237 A1 | 7/2008 | Collins et al. | |
| 2008/0179007 A1 | 7/2008 | Collins et al. | |
| 2008/0274297 A1 | 11/2008 | Furuta et al. | |
| 2008/0286697 A1 | 11/2008 | Verhaverbeke et al. | |
| 2008/0302652 A1 | 12/2008 | Entley et al. | |
| 2009/0025879 A1 | 1/2009 | Rauf et al. | |
| 2009/0066315 A1 | 3/2009 | Hu et al. | |
| 2009/0109595 A1 | 4/2009 | Herchen et al. | |
| 2009/0200268 A1* | 8/2009 | Tappan et al. | 216/67 |
| 2009/0200269 A1* | 8/2009 | Kadkhodayan et al. | 216/71 |
| 2009/0242135 A1 | 10/2009 | Koshimizu et al. | |
| 2009/0272492 A1 | 11/2009 | Katz et al. | |
| 2009/0277585 A1 | 11/2009 | Maebashi et al. | |
| 2009/0305509 A1 | 12/2009 | Stevenson et al. | |
| 2009/0321019 A1 | 12/2009 | Chen et al. | |
| 2010/0008015 A1 | 1/2010 | Booth et al. | |
| 2010/0008016 A1 | 1/2010 | Onate et al. | |
| 2010/0065215 A1 | 3/2010 | Jeon et al. | |
| 2010/0072172 A1 | 3/2010 | Ui et al. | |
| 2010/0098875 A1* | 4/2010 | Fischer et al. | 427/534 |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2013/0127124 A1* | 5/2013 | Nam et al. | 279/128 |
| 2013/0133834 A1* | 5/2013 | Dhindsa | 156/345.51 |
| 2014/0054268 A1* | 2/2014 | Chen et al. | 216/67 |

FOREIGN PATENT DOCUMENTS

| | | |
|---|---|---|
| JP | 5144594 | 11/1993 |
| RU | 2022917 | 11/1994 |
| RU | 2056702 | 3/1996 |
| RU | 2094961 | 10/1997 |
| WO | WO 01 36703 A1 | 5/2001 |

OTHER PUBLICATIONS

PCT International Search Report—PCT/US2012/063987(dated Jan. 28, 2013) (3 pages).

PCT International Search Report—PCT/US2012/065080(dated Jan. 28, 2013) (2 pages).

PCT International Search Report—PCT/US2012/065684 (dated Jan. 28, 2013) (2 pages).

PCT International Search Report—PCT/US2012/65949(dated Feb. 5, 2013 (2 pages_.

PCT International Search Report—PCT/US2012/065677(dated Feb. 7, 2013 (3 pages).

PCT International Search Report—PCT/US2012/66467(dated Feb. 8, 2013) (2 pages).

PCT International Search Report—PCT/US2012/65122—(dated Mar. 25, 2013) (2 pages).

PCT International Search Report—PCT/US2011/001175—dated Nov. 29, 2011 (2 pages).

PCT International Search Report—PCT/US2011/001174 dated Dec. 6, 2011 (2 pages).

PCT International Search Report—PCT/US2011/001176—dated Jan. 19, 2012 (4 pages).

ISR PCT US2012/066425 dated Feb. 22, 2013.

* cited by examiner

CHUCK ASSEMBLY FOR PLASMA PROCESSING

CROSS REFERENCE TO RELATED APPLICATIONS

This application claims priority from U.S. Provisional Patent Application No. 61/563,514 filed on Nov. 23, 2011 and entitled "Peripheral RF Feed and Symmetric RF Return with RF Strap Input," which is incorporated herein by reference in its entirety for all purposes. This application is related to U.S. patent application Ser. No. 13/301,725, filed Nov. 21, 2011, entitled "TRIODE REACTOR DESIGN WITH MULTIPLE RADIOFREQUENCY POWERS," and to U.S. Provisional Patent Application No. 61/563,021, filed Nov. 22, 2011, entitled "SYSTEMS AND METHODS FOR CONTROLLING A PLASMA EDGE REGION," the disclosures of which are incorporated herein by reference.

BACKGROUND

1. Field of the Invention

The present embodiments relate to wafer processing apparatus, and more particularly, apparatus, methods, and computer programs for processing a wafer in a wafer processing apparatus.

2. Description of the Related Art

The manufacturing of integrated circuits includes immersing silicon substrates (wafers) containing regions of doped silicon in chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

Non-uniform etching can adversely impact wafer yield. Moreover, as the size of the critical dimension shrinks with each new generation of devices, and as wafer sizes increase to facilitate production of higher numbers of devices from the same wafer, non-uniformity requirements become ever more stringent. Thus, controlling non-uniformity is key to enabling more advanced technology nodes to be mass produced in a cost-effective manner.

It is in this context that embodiments of the invention arise.

SUMMARY

Embodiments of the disclosure provide apparatus, methods and computer programs for a peripheral RF feed and symmetric RF return for symmetric RF delivery. It should be appreciated that the present embodiments can be implemented in numerous ways, such as a process, an apparatus, a system, a device, or a method on a computer readable medium. Several embodiments are described below.

In one embodiment, a chuck assembly for plasma processing is provided. The chuck assembly includes an electrostatic chuck having a substrate support surface on a first side, a facility plate coupled to the electrostatic chuck on a second side that is opposite the substrate support surface, a peripheral RF feed configured to deliver RF power, the peripheral RF feed having a first portion contacting a periphery of the facility plate and an RF strap coupling the peripheral RF feed to an RF source.

The first portion can be a bowl-shaped section. The chuck assembly can also include a conducting component coupled to the facility plate and defined within an interior of the first portion of the hollow RF feed.

The chuck assembly can also include a symmetrical, grounded shield substantially surrounding the peripheral RF feed. The first portion of the hollow RF feed contacts the periphery of the facility plate at a circumference defined on a side of the facility plate opposite the electrostatic chuck, the circumference can have a radius greater than about one-half of a radius of the facility plate.

The first portion of the peripheral RF feed can include at least one opening for at least one facilities connection to the facility plate. The facility plate can include a non-conductive lift pin system. The facility plate can include a lift pin system that is electrically isolated from the hollow RF feed and the RF strap.

Another embodiment provides a method for powering a chuck assembly for plasma processing. The method includes contacting a first end of a hollow RF feed to a periphery of a facility plate, coupling RF power to a second end of the hollow RF feed with an RF strap, the hollow RF feed delivering the applied RF power to the facility plate.

The delivery of the RF power by the hollow RF feed bypasses a central portion of the facility plate having a conducting component coupled thereto, the conducting component defined within an interior of the hollow RF feed. The conducting component can be at least one of a cooling system component or a heating device or an electrostatic clamping device or a lift pin system.

Applying the RF power to the second end of the hollow RF feed can include contacting the second end at a location lateral to the chuck assembly. Contacting the first end of the hollow RF feed to the periphery of the facility plate can include contacting the periphery at a circumference defined on an underside of the facility plate, the circumference having a radius greater than one-half of a radius of the facility plate.

The method can also include shielding a first portion of the hollow RF feed with a grounded shield. The method can also include shielding a first portion of the hollow RF feed with a substantially symmetrical grounded shield. Contacting the first end of the hollow RF feed to the periphery of the facility plate can include contacting the periphery at a circumference defined on an underside of the facility plate, the circumference having a radius greater than one-half of a radius of the facility plate. At least one facility connection can be provided through a corresponding hole in the hollow RF feed.

Another embodiment provides a chuck assembly for plasma processing. The electrostatic chuck having a substrate support surface on a first side, a facility plate coupled to the electrostatic chuck on a second side that is opposite the substrate support surface, a peripheral RF feed configured to deliver RF power, the peripheral RF feed having a first portion contacting a periphery of the facility plate wherein the first portion of the hollow RF feed contacts the periphery of the facility plate at a circumference defined on a side of the facility plate opposite the electrostatic chuck wherein the first portion of the peripheral RF feed includes at least one opening for at least one facilities connection to the facility plate, an RF strap coupling the peripheral RF feed to an RF source, a substantially symmetrical, grounded shield surrounding the peripheral RF feed. The facility plate can include a lift pin system that is electrically isolated from the hollow RF feed and the RF strap.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe apparatus and methods for a peripheral RF feed and symmetric RF return for symmetric RF delivery. It will be apparent that the present embodiments may be practiced without some or all of these specific details. In other instances, well known process operations have not been described in detail in order not to unnecessarily obscure the present embodiments.

Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer.

In one embodiment, Fluorocarbon gases, such as $CF_4$ and $C-C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

Figure 1:
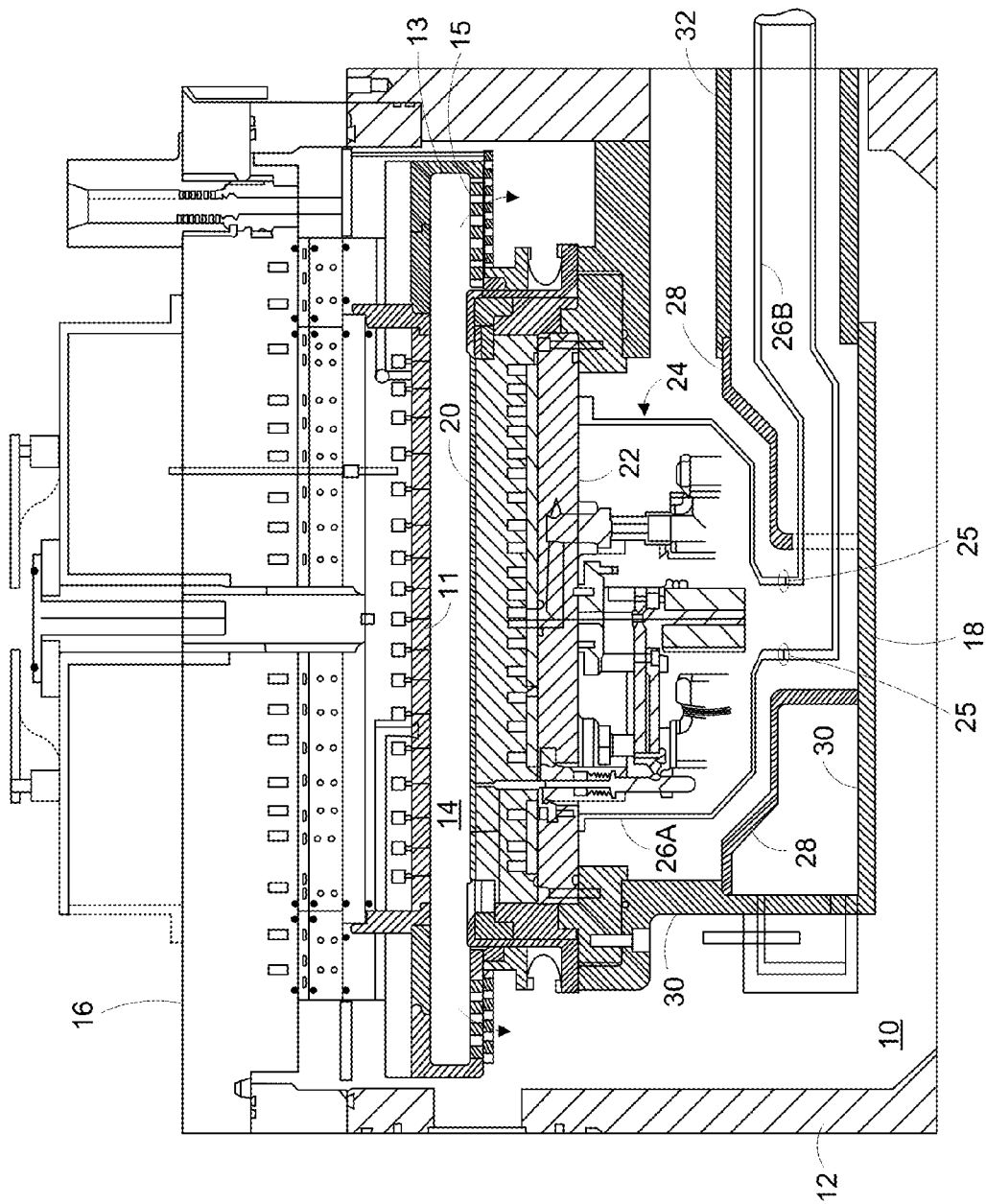
FIG. 1 illustrates a cross section of a plasma reactor, in accordance with an embodiment of the invention.

FIG. 1 illustrates a cross section of a plasma reactor, in accordance with an embodiment of the invention. The reactor includes a surrounding chamber 10 defined by an surrounding chamber wall 12, and a plasma confinement chamber 14 defined by a top electrode assembly 16 and a lower chuck assembly 18. The chuck assembly 18 includes an electrostatic chuck 18 which provides a substrate support surface on its top side, and provides for electrostatic clamping of a substrate to its substrate support surface. A facility plate 22 is coupled to the electrostatic chuck 18 on a side opposite the substrate support surface. Various facility components are coupled to the facility plate 22, such as components relating to heating, cooling, control of lift pins, and electrostatic clamping.

As shown, the top electrode assembly 16 includes a showerhead 11 for feeding process gas into the plasma confinement chamber 14. The top electrode assembly also includes a shroud 13, which engages with the chuck assembly 18 to define the plasma confinement chamber 14. Perforations 15 are defined for gas flow exiting the plasma confinement chamber 14.

A hollow RF feed 24 is coupled to a peripheral portion of the facility plate 22, so as to deliver RF power to the edge of the facility plate 22. This configuration enables the RF current to bypass the interior portion of the facility plate 22, so that child components coupled to the facility plate are not in the path of RF current. In this manner, RF delivery to a substrate situated on the chuck assembly is achieved with high azimuthal uniformity.

The hollow RF feed 24 includes a first portion 26A which connects to the facility plate 22, and a second portion 26B which extends laterally away from the chuck assembly 18. As shown in the illustrated embodiment, the hollow RF feed 24 joins to the periphery of the facility plate 22 at one end, while extending away from the facility plate to a RF source at its opposite end. The first portion 26A which connects to the facility plate is a bowl-shaped section having a larger diameter than the second portion 26B, which is a tubular section extending away from the chuck assembly. The second portion 26B connects to a hole in the bowl-shaped section defined by the first portion 26A at an interface 25. Thus, various child components coupled to the facility plate are contained within the interior of the first portion 26A of the hollow RF feed.

Additionally, a ground shield 28 is provided as part of the chuck assembly 18. The ground shield 28 facilitates a substantially symmetric RF return current path. The ground shield 28 is defined so as to surround the region of the hollow RF feed 24 where the first portion 26A and the second portion 26B are connected. Thus, the ground shield 28 defines a barrier between the first portion 26A and the second portion 26B of the hollow RF feed 24. The ground shield 28 is connected to the chuck assembly wall 30, from which a RF ground adapter tube 32 extends to ground. Together, the chuck assembly wall 30, the ground shield 28, and the RF ground adapter tube 32 from a return path for the RF current delivered via the hollow RF feed tube 24. It will be noted that part of the second portion 26B of the hollow RF feed is defined within the interior of the RF ground adapter tube 32. This part of the second portion 26B of the hollow RF feed and the RF ground adapter tube 32 together define a coaxial section.

Figure 2:
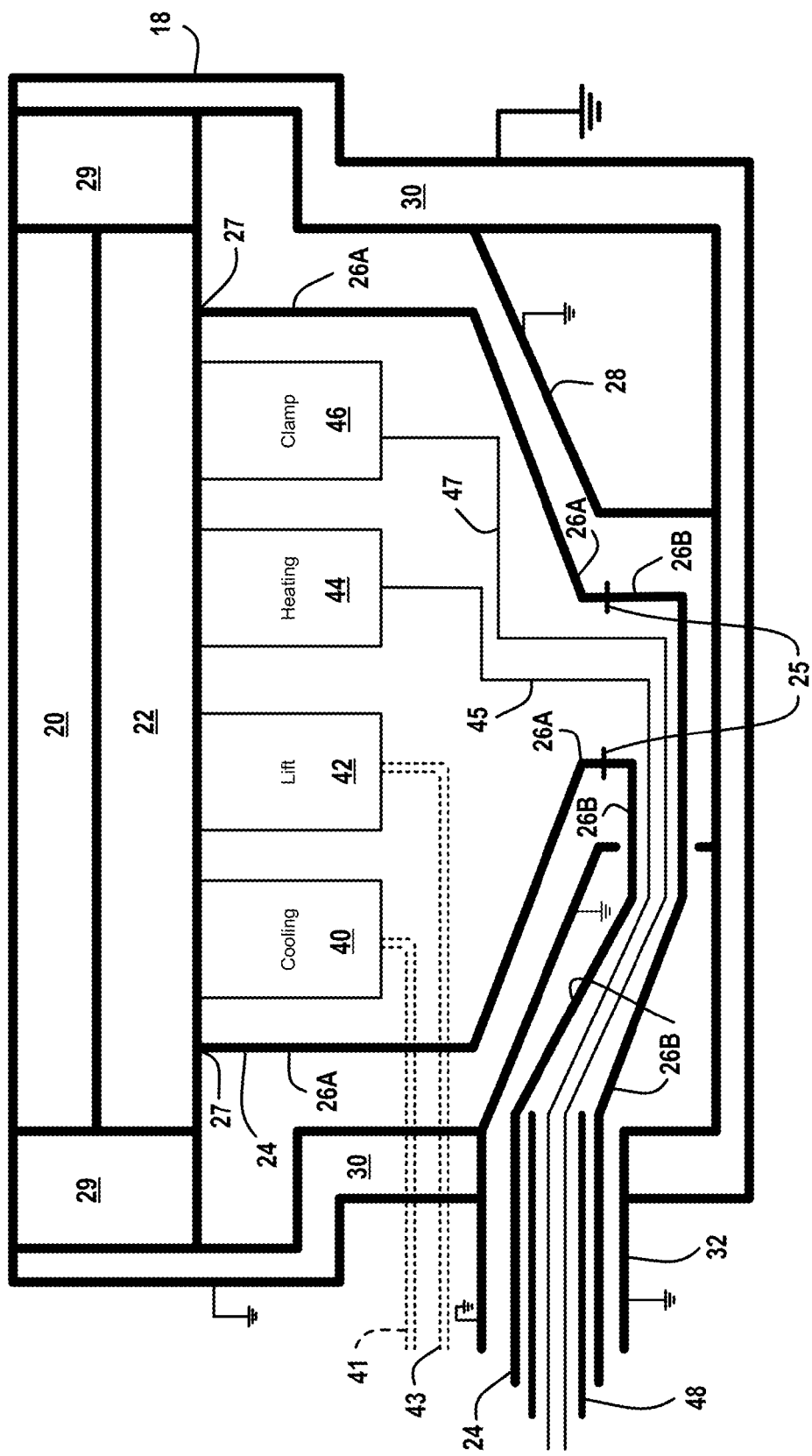
FIG. 2 illustrates a cross section schematic of the chuck assembly 18, in accordance with an embodiment of the invention.

FIG. 2 illustrates a cross section schematic of the chuck assembly 18, in accordance with an embodiment of the invention. As shown, various child components are coupled to the facility plate 22, including cooling component 40, lift pin system 42, heating component 44, and clamping component 46. The heating and clamping components are electrically conductive, and therefore especially likely to interfere with symmetric RF delivery and return in conventional plasma processing systems. However, even components, such as liquid or gas-based cooling components and pneumatic lift pin system, can be conductive or non-conductive and conductive liquids or gases contained therein can also reduce symmetry of RF delivery to the substrate in conventional systems, because the coupling to the facility plate may necessitate alterations in the surface structure of the facility plate. The hollow RF feed as disclosed herein delivers RF power directly to the periphery of the facility plate providing improved symmetry of RF delivery because the child components are not in the path of the RF delivery.

The first portion 26A of the hollow RF feed connects to the facility plate 22 at a circumference 27 defined on the underside of the facility plate 22. The circumference 27 is defined at the periphery or edge of the facility plate 22. The circumference 27 is concentric with the facility plate 22. In one embodiment, the circumference 27 has a radius that is greater than one-half the radius of the facility plate 22 but less than the full radius of the facility plate 22.

The electrostatic chuck 18 and the facility plate 22 are separated from the chuck assembly wall 30 by a dielectric spacer 29. The RF path can broadly be defined by an RF delivery path to a substrate, and an RF return path. The RF delivery path provides for RF delivery along the hollow RF feed 24 to the circumference 27 of the facility plate 22, and around the edges of the facility plate 22 and electrostatic chuck 18 to the substrate. The RF return path follows along the chuck assembly wall 30 and the ground shield 28, ultimately connecting to ground via the RF ground adapter tube 32.

In the illustrated embodiment, fluid tubes 41 and 43 for connecting to the cooling component 40 and lift pin system 42, respectively, are permitted to cross the hollow RF feed 24 because they are non-conducting and cause little interference with the symmetry of RF delivery. However, facility wires 45 and 47 for heating component 44 and clamping component 46, respectively, are carried within the interior of the hollow RF feed 24.

At a minimum for a system including the heating component 44 and the clamping component 46, there are two wires per component, for a total of at least four wires. In some embodiments, there may be additional heating component wires. For example, in one embodiment there are four heating zones each of which is provided with a pair of wires. In such an embodiment, there are a total of ten wires which are fed through the hollow RF feed 24 to the heating component 44 and clamping component 46.

In one embodiment, an insulated tube 48 is provided within the second portion 26B of the hollow RF feed. The insulated tube 48 is composed of an insulating material such as Teflon®.

Figure 3:
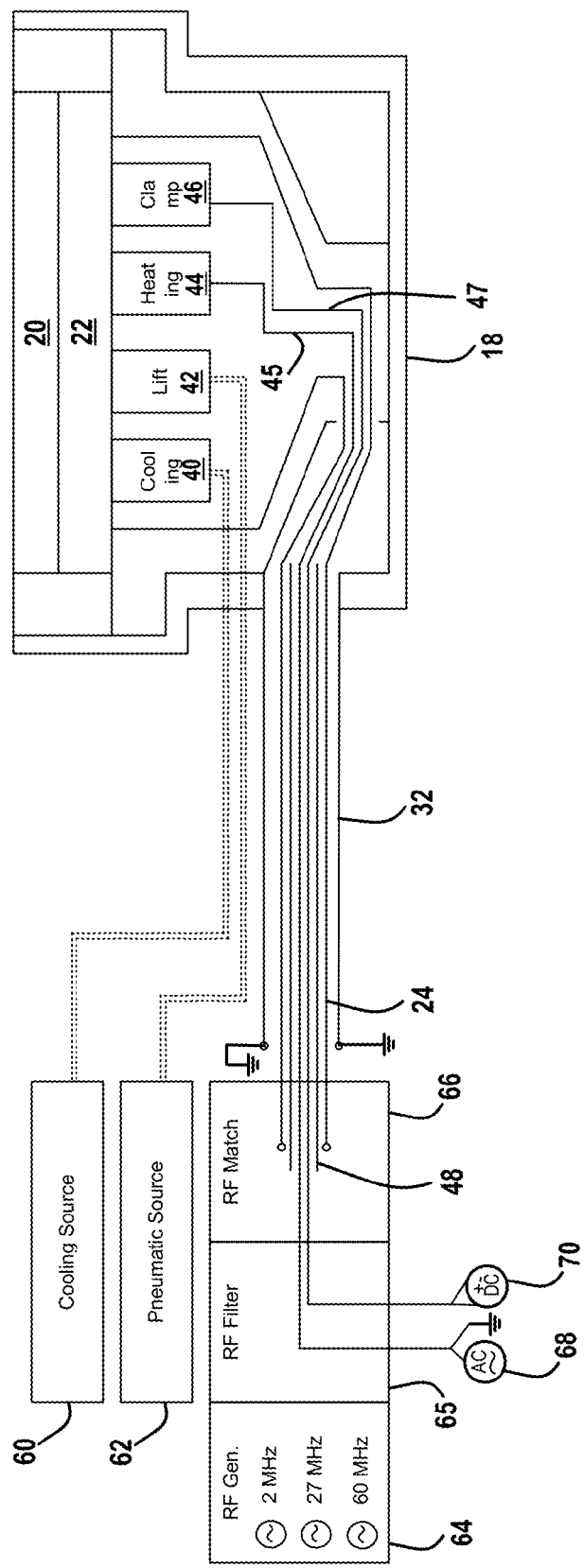
FIG. 3 illustrates various systems connected to a chuck assembly, in accordance with an embodiment of the invention.

FIG. 3 illustrates various systems connected to a chuck assembly, in accordance with an embodiment of the invention. As shown, the cooling component 40 connects to a cooling source 60, which provides liquid or gaseous fluids for cooling the electrostatic chuck 18. The lift component 42 connects to a pneumatic source 62, which provides compressed gas for controlling lift pins which facilitate disengagement of a substrate from the electrostatic chuck 18.

The hollow RF feed 24 is supplied with RF power from an RF generator 64, via an RF filter 65 and RF match 66. Wires 45 provide current to heating component 44 from an AC source 68. Wires 47 provide current to clamping component 46 from a high voltage DC source 70.

Figure 4:
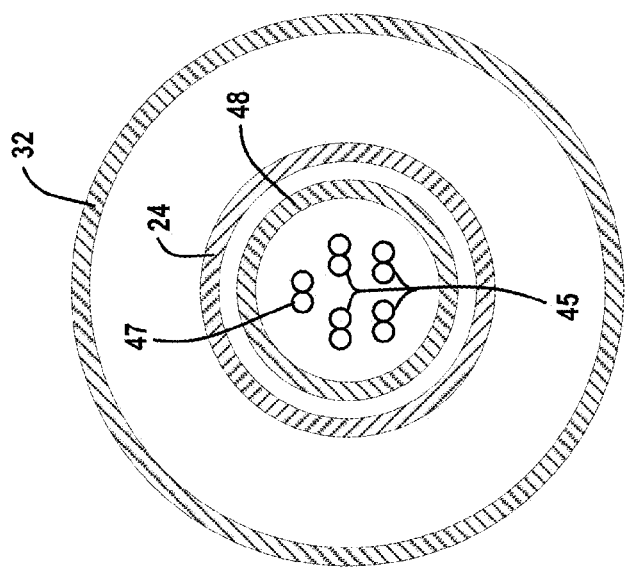
FIG. 4 illustrates a cross section of a portion of the hollow RF feed and RF ground adapter tube, in accordance with an embodiment of the invention.

FIG. 4 illustrates a cross section of a portion of the hollow RF feed and RF ground adapter tube, in accordance with an embodiment of the invention. As shown, the configuration of the portion of the hollow RF feed 24 inside of the RF ground adapter tube 32 defines a coaxial segment where the hollow RF feed 24 acts as the inner conductor and the RF ground adapter tube 32 acts as the outer conductor, so as to promote low-loss transmission of RF power without causing interference to nearby components.

Additionally, the insulated tube 48 is shown inside of the hollow RF feed 24. According to one embodiment, the insulated tube 48 is a Teflon® tube. In the illustrated embodiment, there are four pairs of wires 45 which connect to four distinct zone heating elements, and one pair of high voltage wires 47 for electrostatic clamping. In one embodiment, the wires are threaded through RF feed straps.

Figure 5:
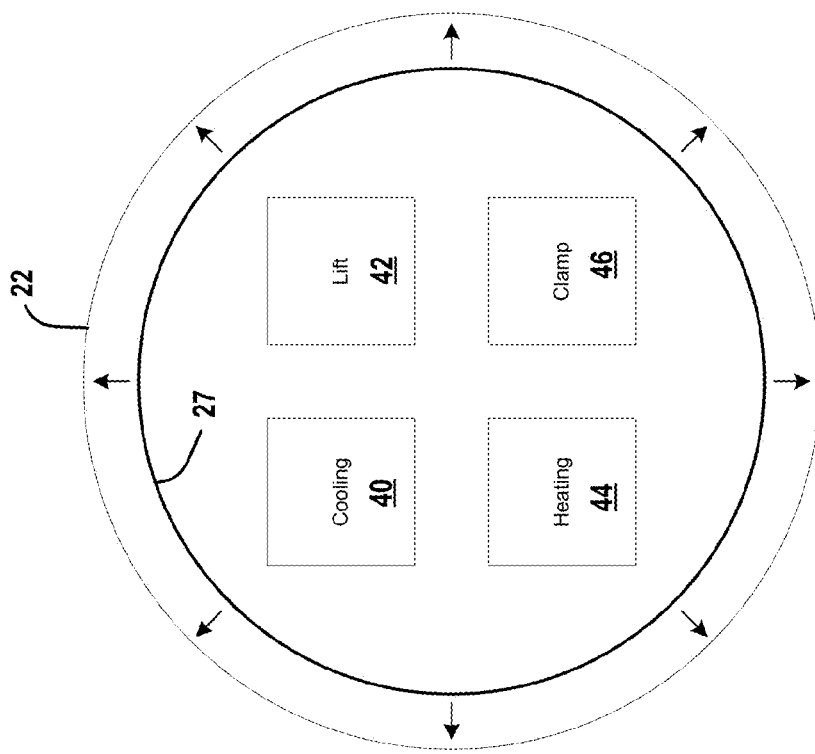
FIG. 5 illustrates the underside of the facility plate of the chuck assembly, in accordance with an embodiment of the invention.

FIG. 5 illustrates the underside of the facility plate of the chuck assembly, in accordance with an embodiment of the invention. As shown, the facility plate 22 has various facility components coupled thereto, including cooling component 40, lift component 42, heating component 44, and clamping component 46. The hollow RF feed contacts the facility plate at the circumference 27 defined at the periphery of the underside of the facility plate 22. As shown, the circumference 27 is concentric with the facility plate so as to facilitate symmetric RF delivery from the hollow RF feed to the edge of the facility plate 22. Furthermore, the circumference encircles the positions of the various facility components on the facility plate 22, so that the facility components are not in the RF delivery path. In one embodiment, the radius of the circumference 27 is at least one-half the radius of the facility plate 22. In another embodiment, the radius of the circumference 27 is at least two-thirds the radius of the facility plate 22. In still other embodiments, the circumference 27 can have any radius that defines the circumference 27 in a peripheral vicinity of the facility plate 22.

Figure 6:
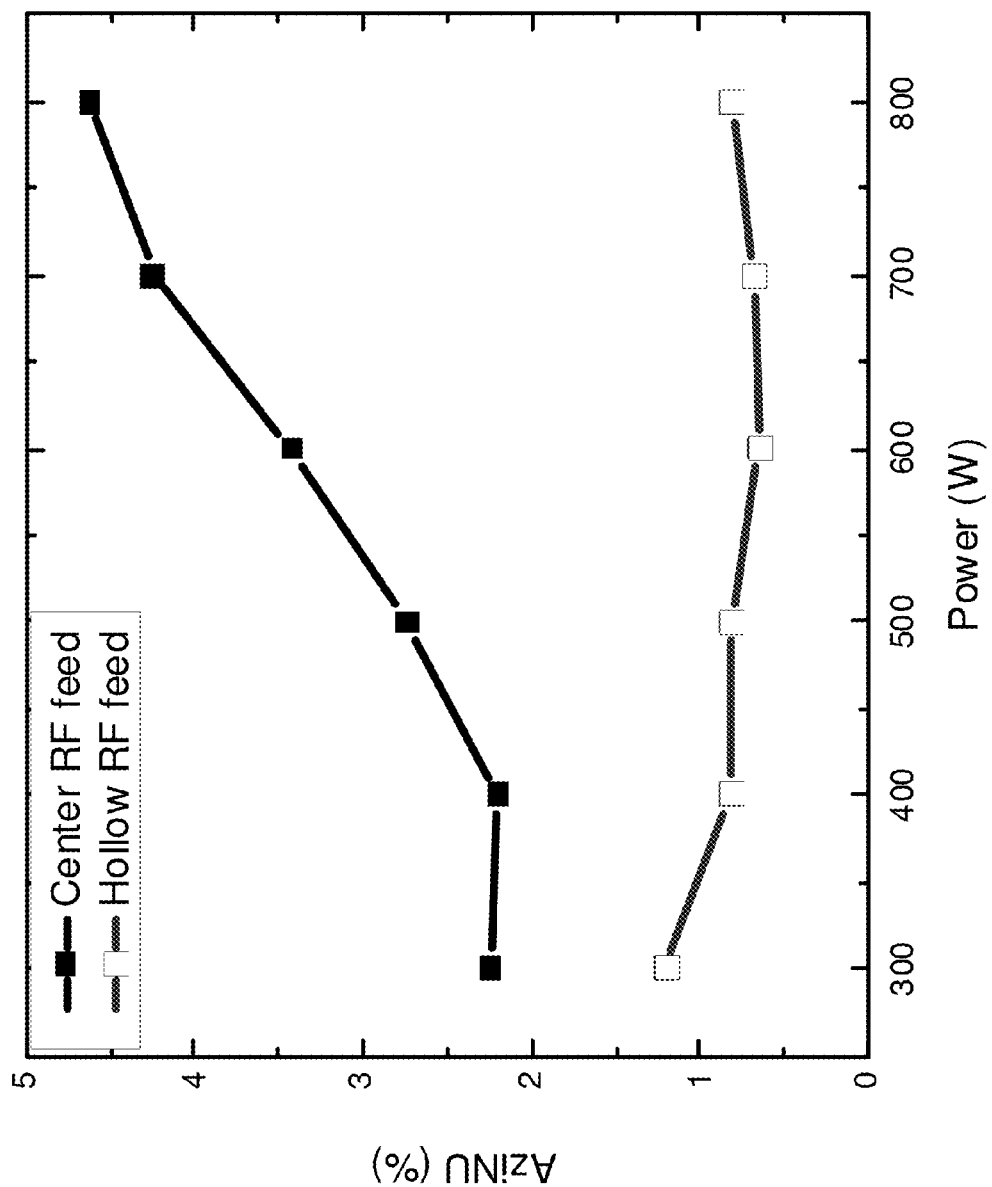
FIG. 6 is a graph comparing azimuthal nonuniformity of substrates processed using a chuck assembly having a center RF feed versus a chuck assembly having a hollow RF feed, in accordance with an embodiment of the invention.

FIG. 6 is a graph comparing azimuthal nonuniformity of substrates processed using a chuck assembly having a center RF feed versus a chuck assembly having a hollow RF feed, in accordance with an embodiment of the invention. As can be seen, substrates processed using a chuck assembly having a hollow RF feed as described herein demonstrate noticeably lower levels of azimuthal non-uniformity. This holds true across of range of RF power settings, with the improvement in azimuthal non-uniformity of the hollow RF feed over the center RF feed generally increasing with increasing power.

Between 300 and 800 watts, the azimuthal nonuniformity for a center RF feed approximately doubles. By contrast, the hollow RF feed demonstrates fairly constant azimuthal non-uniformity across the same power range, with a lower level of non-uniformity overall as well. Azimuthal nonuniformity was measured by measuring etch rates of a blank wafer, and subtracting for radial nonuniformity. Additional details regarding the measurement of various metrics may be found with reference to U.S. Pat. No. 7,239,737, issued Jul. 3, 2007, entitled "USER INTERFACE FOR QUANTIFYING WAFER NON-UNIFORMITIES AND GRAPHICALLY EXPLORE SIGNIFICANCE," the disclosure of which is herein incorporated by reference.

Figure 7A:
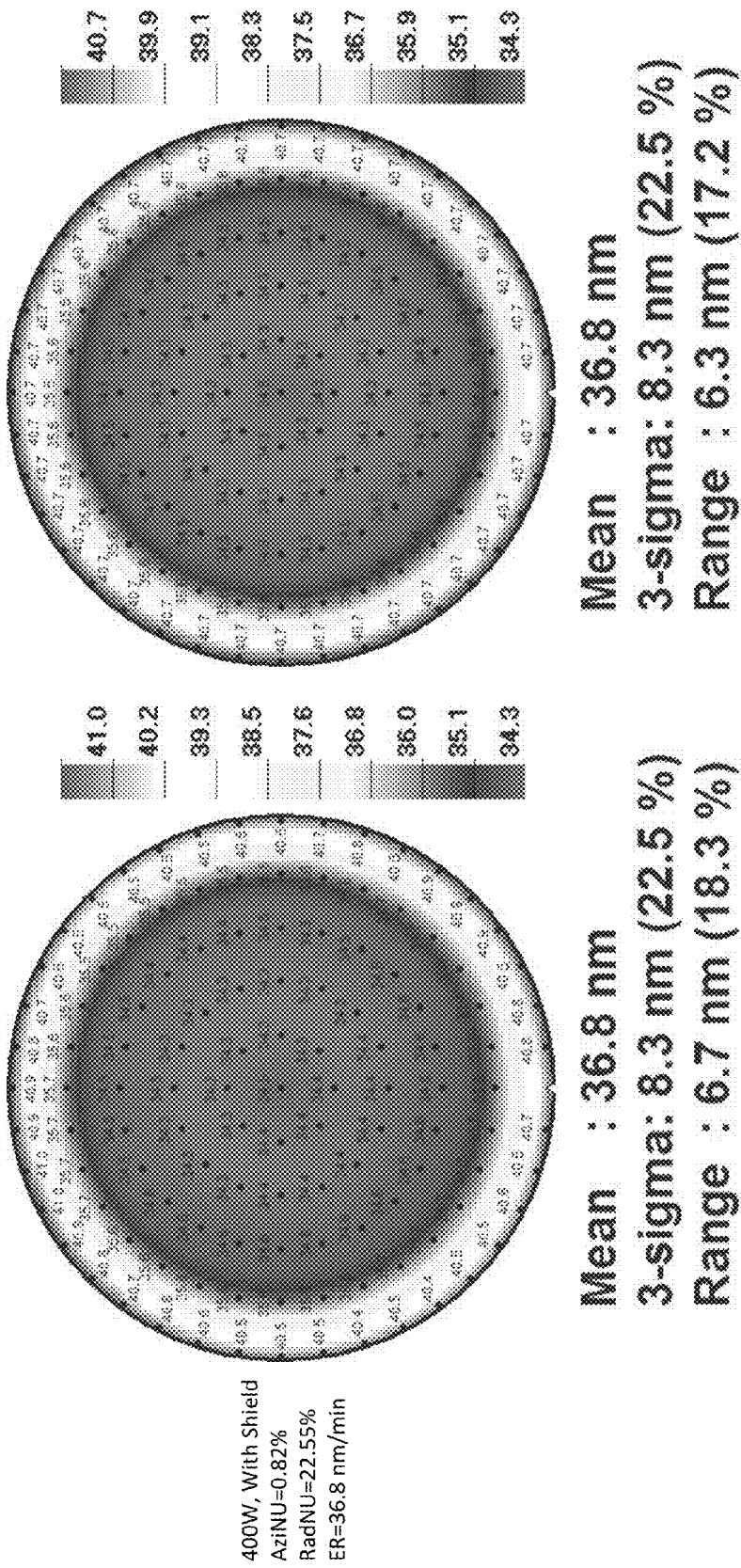
FIG. 7A illustrates etch rates for a wafer on a chuck assembly including a ground shield, in accordance with an embodiment of the invention.
Figure 7B:
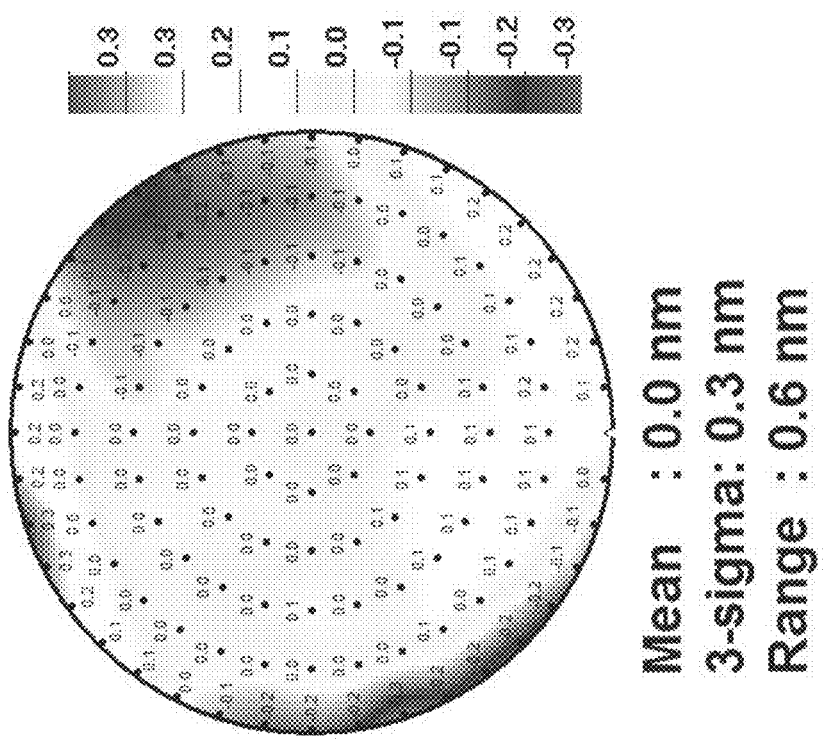
FIG. 7B illustrates etch residual scan for the wafer in FIG. 7A, in accordance with an embodiment of the invention.
Figure 7C:
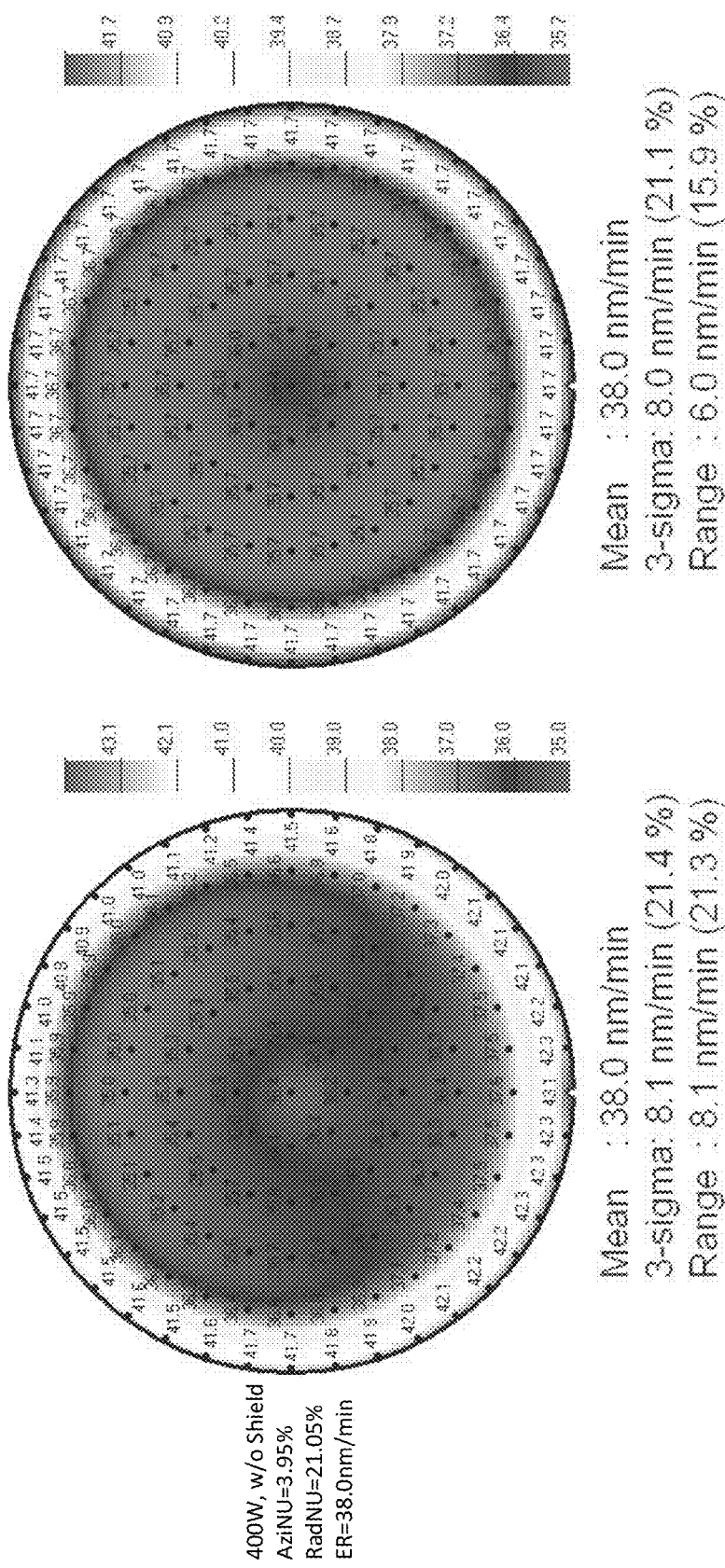
FIG. 7C illustrates etch rates for a wafer on a chuck assembly without the ground shield.
Figure 7D:
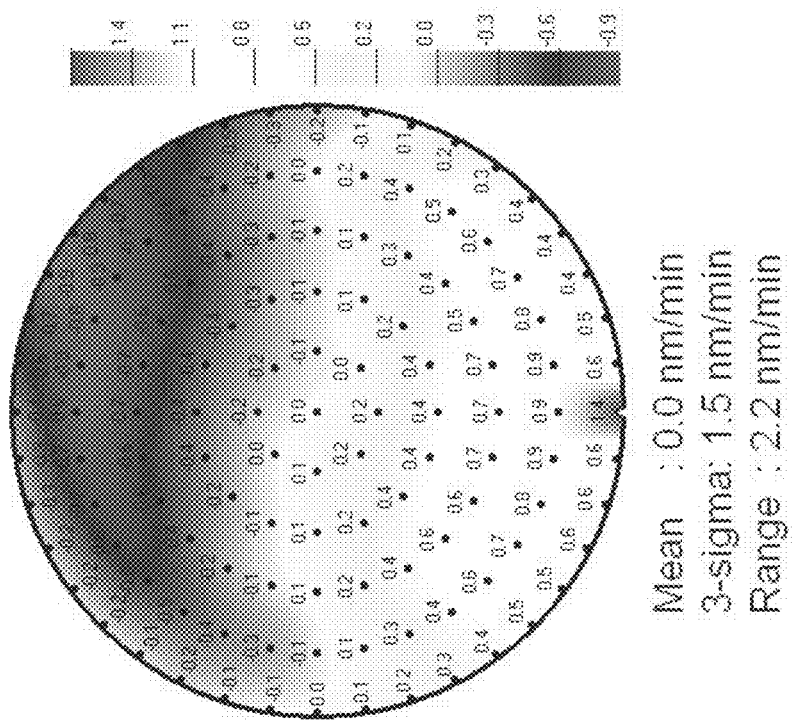
FIG. 7D illustrates etch residual scan for the wafer in FIG. 7C.

FIGS. 7A-D illustrate the effect of the ground shield on azimuthal nonuniformity, in accordance with an embodiment of the invention. Specifically, FIG. 7A illustrate etch rates for a wafer on a chuck assembly including a ground shield as described herein. FIG. 7B illustrates etch residual scan for the wafer in FIG. 7A, in accordance with an embodiment of the invention. As shown, the azimuthal nonuniformity is 0.82%. Whereas FIG. 7C illustrates etch rates for a wafer on a chuck assembly without the ground shield. FIG. 7D illustrates etch residual scan for the wafer in FIG. 7C. In this instance, the azimuthal nonuniformity is significantly increased to 3.95%. Thus it can be seen that the ground shield, which provides for improved symmetry of the RF return path, provides significant benefits in terms of reducing azimuthal uniformity.

Figure 8:
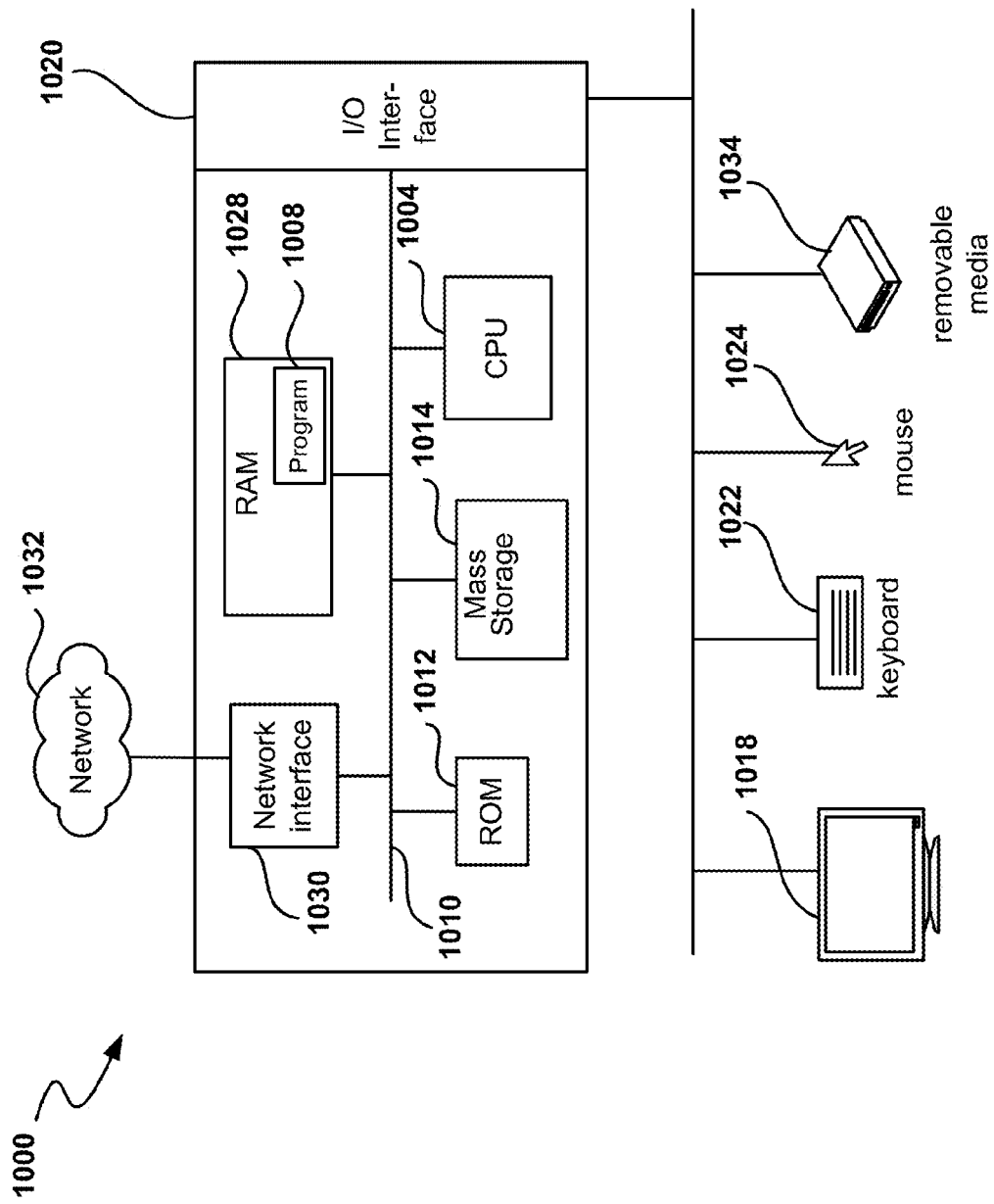
FIG. 8 is a simplified schematic diagram of a computer system for implementing embodiments described herein.

FIG. 8 is a simplified schematic diagram of a computer system for implementing embodiments described herein. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Phase control program 1008 resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Peripheral RF Feed with RF Strap Input

The foregoing described embodiments include peripheral RF feed with the hollow RF feedstock. However the design requires significant redesign of the chamber is to be used in. Some of the benefits of the peripheral RF feed (i.e., the first portion 26A as described above) can still be gained even without the hollow RF feed (i.e., second portion 26B described above) and while using a typical strap RF input. By way of example the peripheral RF feed 26A provides a symmetrical RF feed to the electrostatic chuck. The symmetrical RF feed improves uniformity of the plasma formed above the electrostatic chuck. A symmetrical RF return can further improve the uniformity of the plasma formed above the electrostatic chuck.

Figure 9:
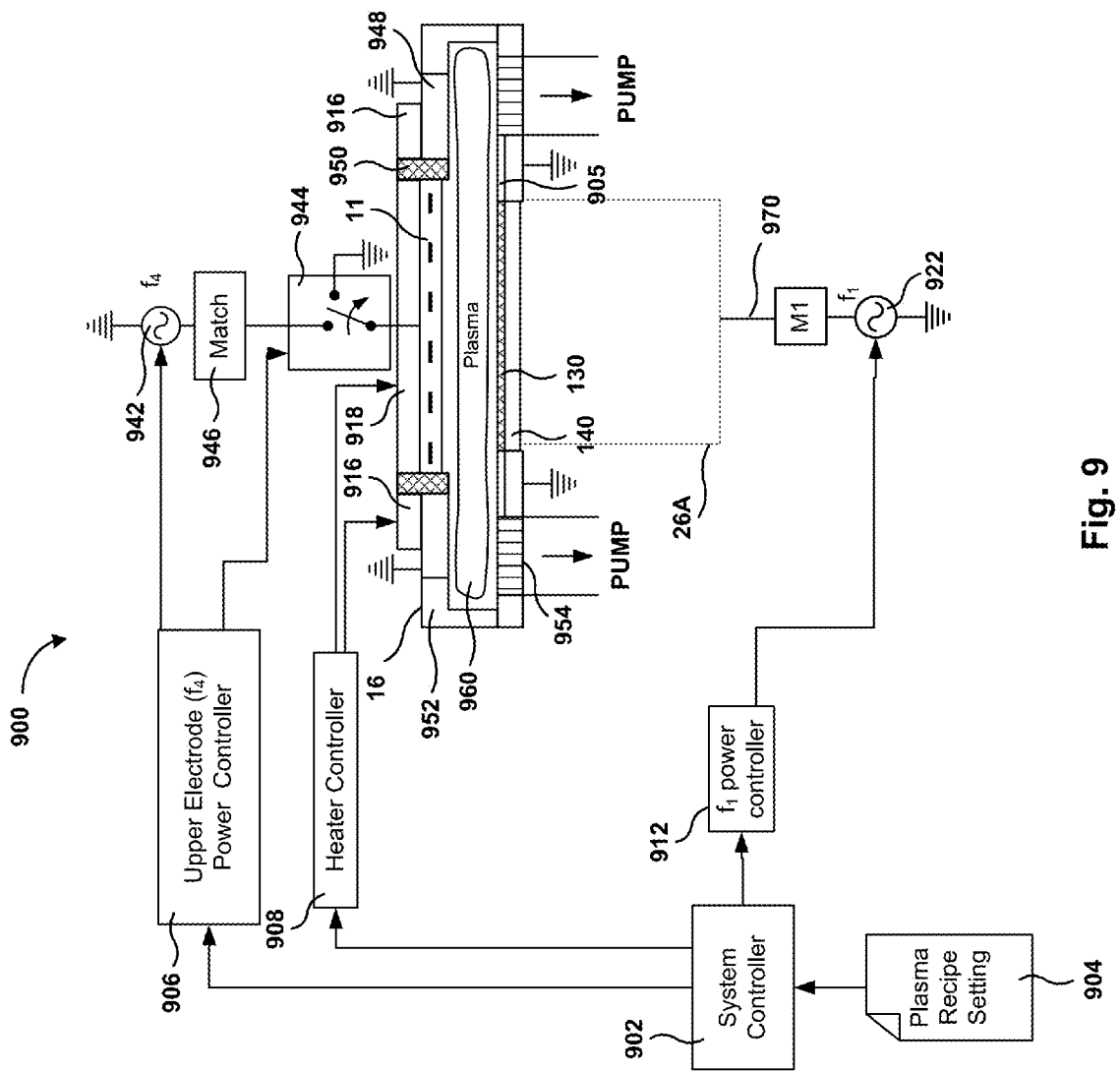
FIG. 9 is a plasma chamber, in accordance with embodiments of the present invention.

FIG. 9 is a plasma chamber 900, in accordance with embodiments of the present invention. The chamber of FIG. 9 includes RF power source 922 with RF frequency $f_1$, which is connected to the bottom electrode 108 via the matching network M1. The top electrode assembly 16 is connected to a second RF power source 942, having an RF frequency $f_4$, via switch 944 and matching network 946.

Further, the chamber includes a switch 944 that connects the top electrode assembly 16 to either ground potential or to RF power source 942 via matching network 946. A first heater 918 is situated above the showerhead 11, and a second heater 916 is situated above ground electrode 948. The heaters 918, 916 are isolated from the showerhead 11 and the ground electrode by a layer of aluminum nitrate material, although other insulators may also be utilized. Heater 916 controls the temperature in the outer area of the ground electrode, and heater 918 controls the temperature of the showerhead 11. Each heater 918, 916 is operable to be turned on or turned off independently during a substrate processing operation.

The wafer processing apparatus further includes system controller 902, top electrode power controller 906, heater controller 908, and power controller 912 for $f_1$. System controller 902 receives a plasma recipe 904, which includes instructions for the different operations performed on the chamber. Processing of the wafer may be done in multiple operations, and each operation may require different settings in the chamber. For example, in one operation both RF power sources 922, 942 are applied, while in other operations only one of the RF power sources are applied.

Based on the recipe 904, the system controller sets the operational parameters of the chamber, including which RF power sources are turned on or turned off, their voltages and power settings, the setting of switch 944, the settings for heaters 916 and 918 degrees, the gasses used in the chamber, the pressure on the chamber, the duration of the wafer-processing operation, etc. In one embodiment, the system controller 902 sends instructions to upper electrode power controller 906 for the configuration of the power on the top electrode, which includes setting switch 944 to connect the showerhead 11 to ground or to RF power, and turning on or off RF power 942, as well as setting the power level for RF power 942.

System controller 902 interfaces with heater controller 908 to regulate the temperature of the showerhead 11. Heater controller 908 regulates heaters 916, 918 to control the temperature of the showerhead 11. A temperature sensor (not shown) provides information to heater controller 908 on the temperature of the upper electrode in one or more points of the showerhead 11. Therefore, heater controller 908 may regulate the temperature on the showerhead 11 by turning on or off the heaters 916, 918 to achieve a desired temperature during wafer processing.

System controller also 902 interfaces with power controller 912, which regulate whether the RF power 922, is turned on or off, and if the power is turned on, to what power setting. In one embodiment, the frequency of RF power source 942 is 400 kHz. In another embodiment, the frequency is in the range from 400 kHz to 2 MHz, while in yet another embodiment the frequency is in the range from 100 kHz to 10 MHz. In some operations, the three bottom RF powers are not turned on simultaneously, which allows having a higher frequency at the top RF. In one embodiment, $f_4$ is different from the frequency $f_1$ at the bottom in order to avoid resonance on the chamber.

In one embodiment, the pressure in the chamber has a value between 20 mTorr and 60 mTorr. In another embodiment, the voltage of the top power source can be in the range of hundreds of volts (e.g., 100 V to 2000 V or more), and the bottom RF power sources can have a voltage up to 6000 V or more. In one embodiment, the voltage is 1000 V. In another embodiment, the voltage of the top RF power source has a value between 100 V and 600 V, and the voltage of the bottom RF power sources has a value between 1000 V and 6000V. The pressure in the chamber can have a value between 10 mTorr and 500 mTorr. In one embodiment, the chamber operates at a pressure of 15 mTorr.

It is noted that the embodiment illustrated in FIG. 9 is exemplary. Other embodiments may utilize different types of chambers, different frequencies, other types of adjustments for the chamber configuration based on the recipe, different pressures in the chamber, etc. For example, in one embodiment, the chamber is a CCP plasma chamber. Furthermore, some of the modules described above in the semiconductor wafer processing apparatus may be combined into a single module, or the functionality of a single module may be performed by a plurality of modules. For example, in one embodiment, power controller 912 are integrated within system controller 902, although other configurations are also possible. The embodiment illustrated in FIG. 9 should therefore not be interpreted to be exclusive or limiting, but rather exemplary or illustrative.

Figure 10:
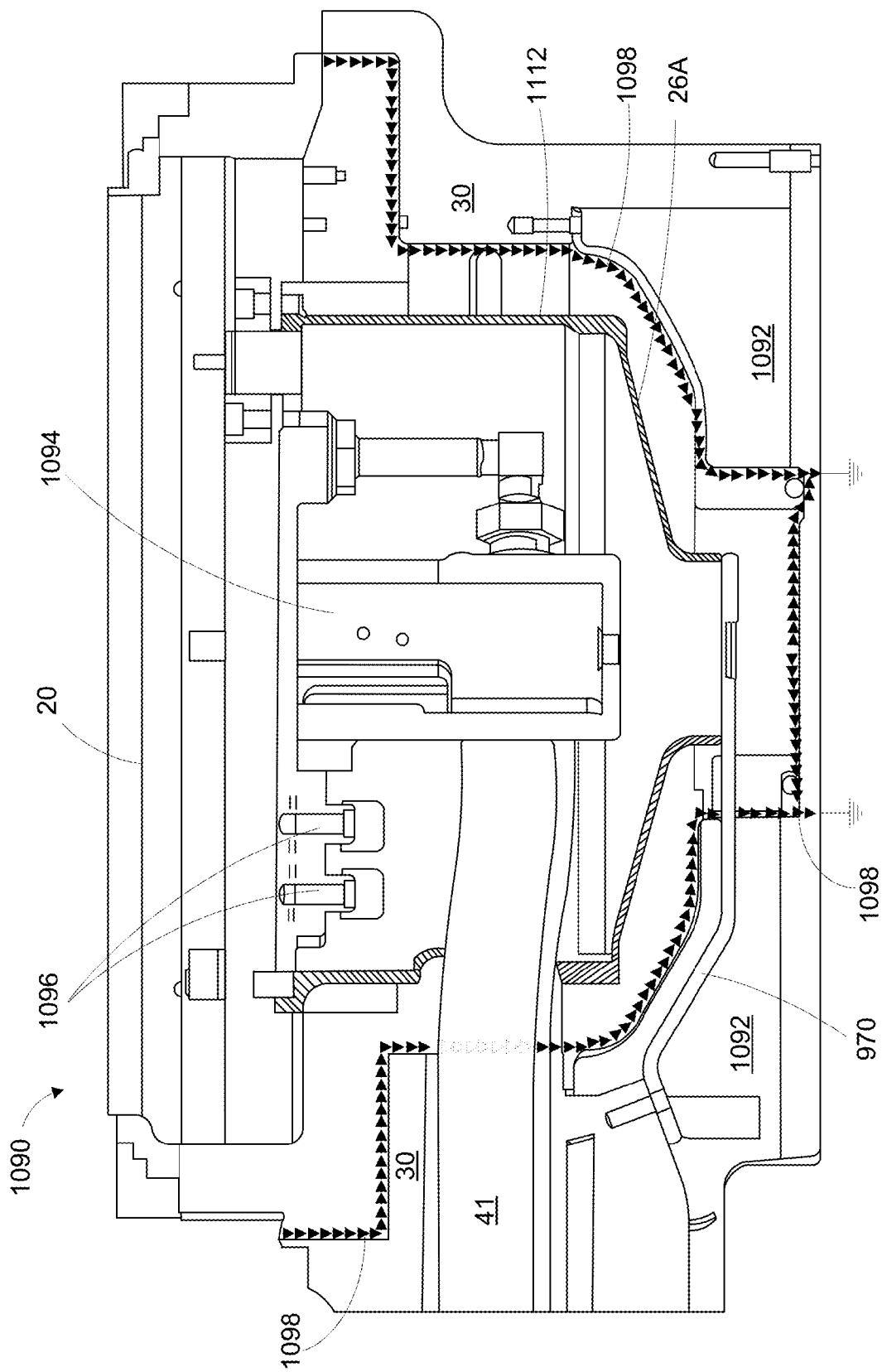
FIG. 10 is a side cutaway view of a electrostatic chuck assembly, in accordance with embodiments of the present invention.
Figure 11A:
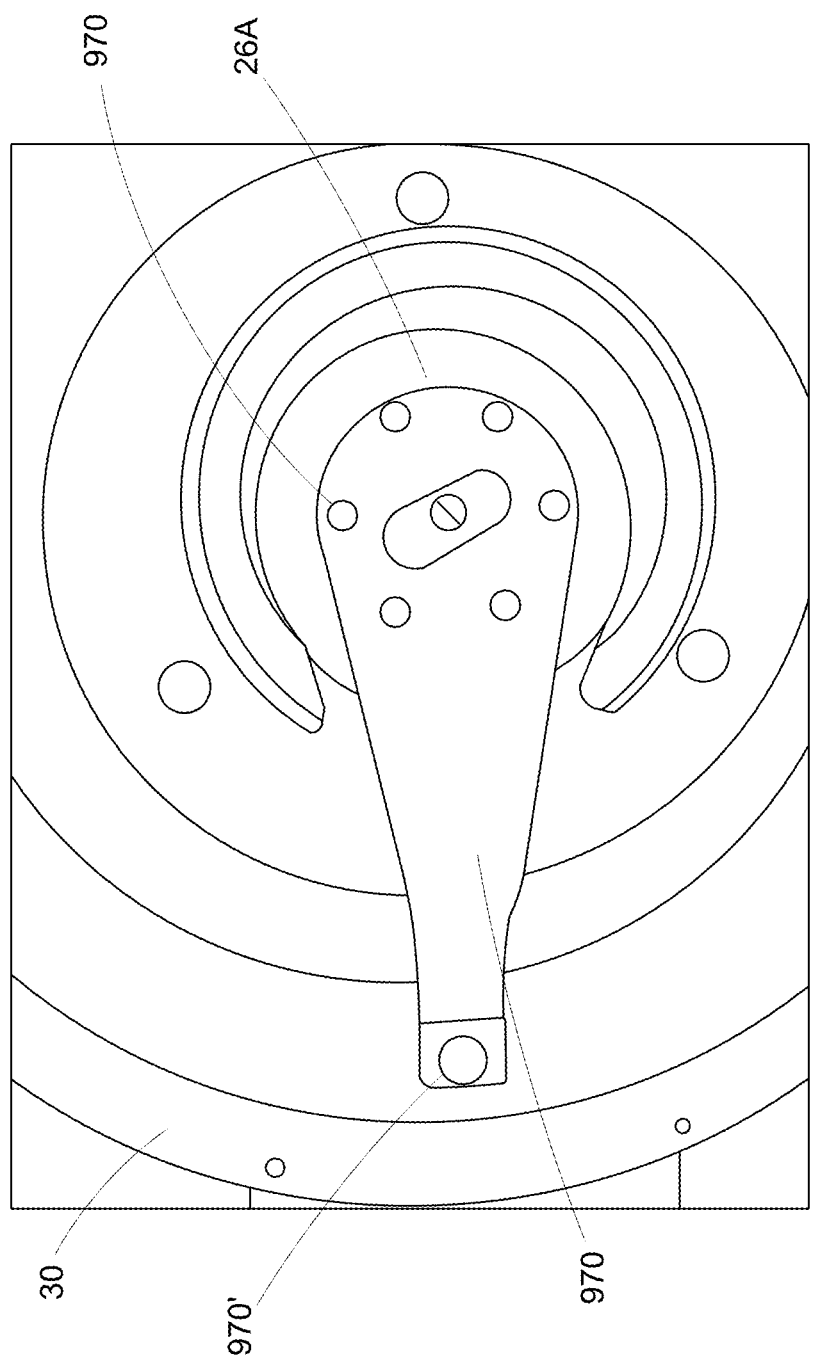
FIGS. 11A-E are views of the peripheral RF feed, in accordance with embodiments of the present invention.
Figure 11B:
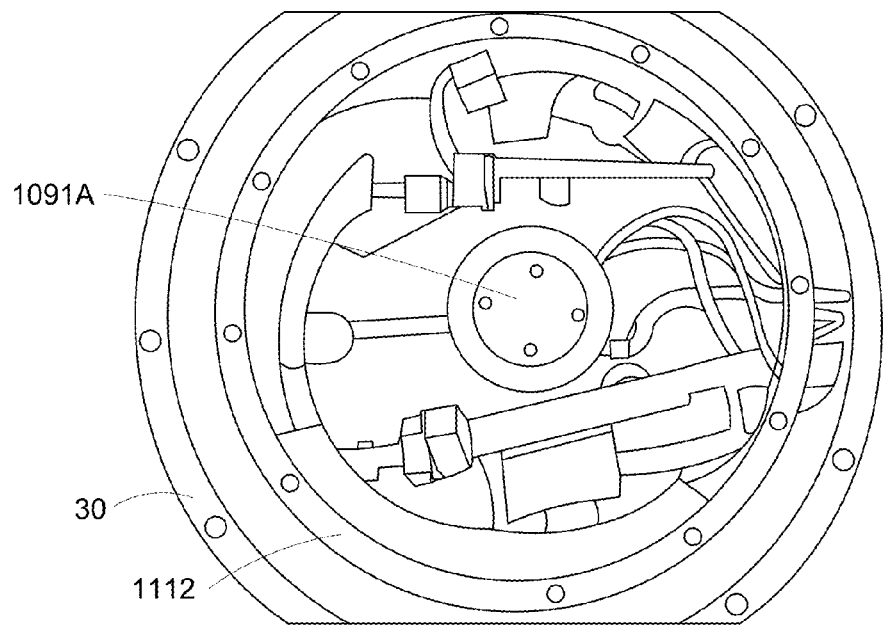
Figure 11C:
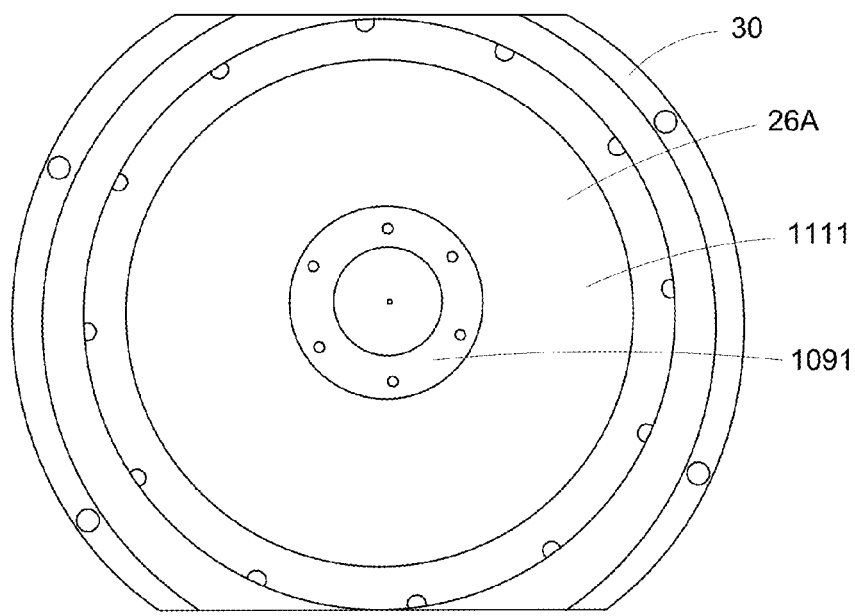
Figure 11D:
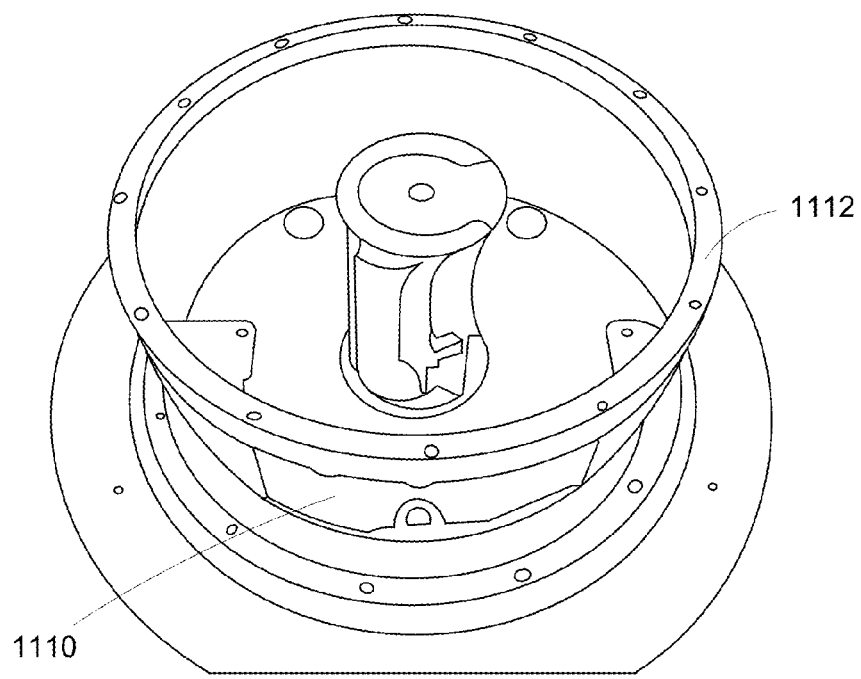
Figure 11E:
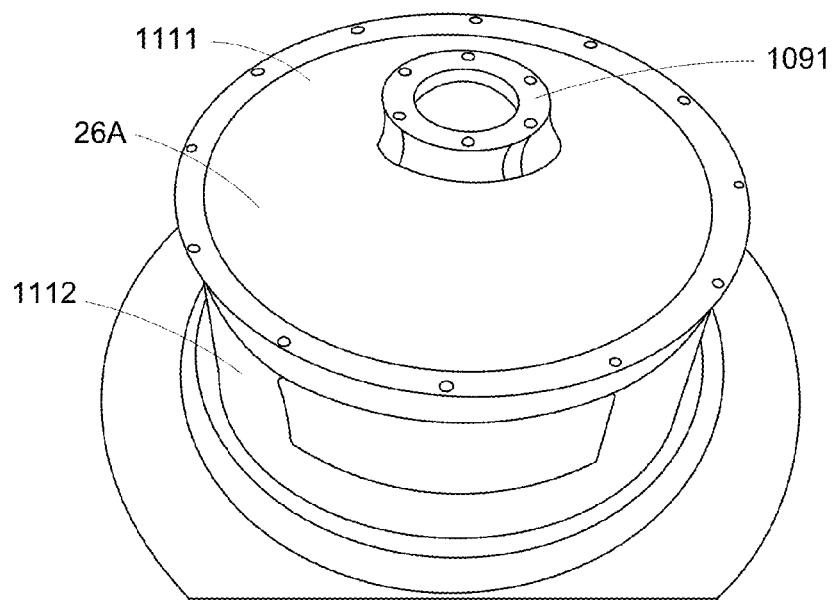

The peripheral RF feed 26A provides a symmetrical RF feed to the electrostatic chuck 18. The input to the peripheral RF feed 26A is an RF strap 970. FIG. 10 is a side cutaway view of an electrostatic chuck assembly 1090, in accordance with embodiments of the present invention. The electrostatic chuck assembly 1090 includes a peripheral RF feed 26A with an RF strap input 970. The electrostatic chuck assembly 1090 also includes a symmetrical RF return path 1098 through the chuck assembly wall 30 to the chamber wall 1092 and child components 1094, 1096 for supplying facilities to the electrostatic chuck. The child components 1094 can be a lift pin system that is made from non-conductive material and/or is electrically isolated from the peripheral RF feed.

FIGS. 11A-E are views of the peripheral RF feed 26A, in accordance with embodiments of the present invention. The RF strap input 970 is coupled to the peripheral RF feed 26A by multiple bolts at mounting flange 1091. The opposing end 970' of the RF strap input 970 is coupled to RF source 922 (not shown). The chuck assembly wall 30 is shown as a substantially symmetrical physical shape to the peripheral RF feed 26A.

The peripheral RF feed 26A has two parts: and input plate 1111 and a sidewall assembly 1112 that couples the input plate to the facilities plate of the chuck assembly as described above. An opening in the sidewall assembly 1112 is provided for facilities (power, coolant, gases, vacuum, instrumentation, etc.) access to the inside the chuck assembly.

Figure 12:
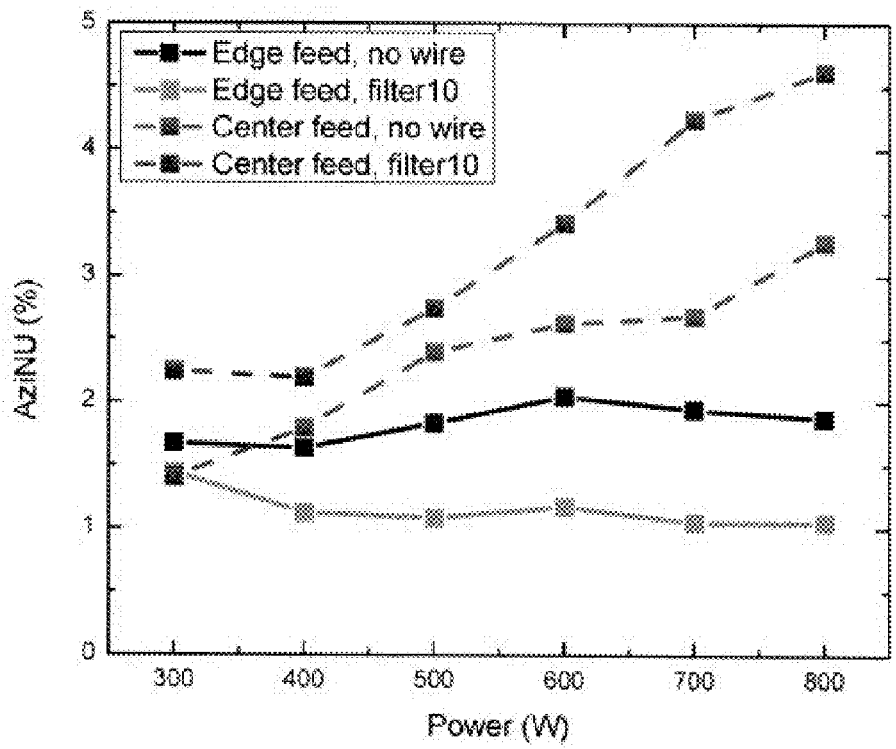
FIG. 12 is a graph of the performance gains by using the peripheral RF feed, in accordance with embodiments of the present invention.

FIG. 12 is a graph of the performance gains by using the peripheral RF feed 26A, in accordance with embodiments of the present invention. The solid lines represent test data for the peripheral RF feed 26A. The dashed lines represent test data for the prior art, center feed RF. As shown in both graphs, the solid lines are more horizontal (have less variation) than the dashed lines over a broad spectrum of power settings.

Figure 13:
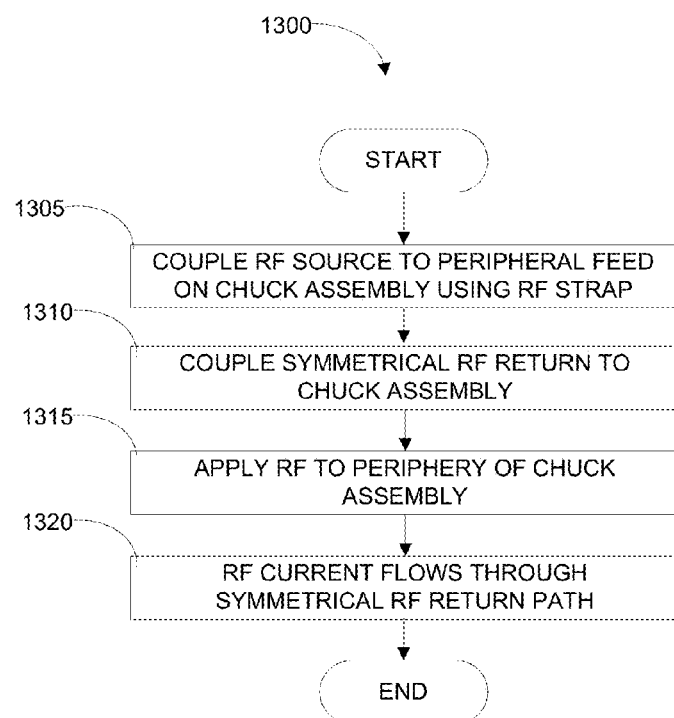
FIG. 13 is a flowchart diagram that illustrates the method operations performed in applying a peripheral RF feed, in accordance with embodiments of the present invention.

FIG. 13 is a flowchart diagram that illustrates the method operations 1300 performed in applying a peripheral RF feed, in accordance with embodiments of the present invention. The operations illustrated herein are by way of example, as it should be understood that some operations may have sub-operations and in other instances, certain operations described herein may not be included in the illustrated operations. With this in mind, the method and operations 1300 will now be described.

In an operation 1305 an RF source is coupled to the peripheral feed 26A using the RF strap 970. A symmetrical RF return is coupled to the chuck assembly 18, in an operation 1310.

In an operation 1315, an RF signal is applied to the periphery of chuck assembly 18. The RF return current flows through symmetrical RF return path, in an operation 1320, and the method operations can end.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims

What is claimed is:

1. A chuck assembly for plasma processing, comprising:
   an electrostatic chuck having a substrate support surface on a first side;
   a facility plate coupled to the electrostatic chuck on a second side that is opposite the substrate support surface;
   a plurality of facility components coupled to the facility plate, the plurality of facility components including at least one of a group consisting of a heating component, a cooling component, a lift pin system component, a gas distribution component, at least one vacuum port, an instrumentation probe and/or an electrostatic clamping component;
   a peripheral RF feed configured to deliver RF power, the peripheral RF feed having a first portion contacting a substantial entirety of a periphery of the facility plate, the facility plate coupling the RF power from the peripheral RF feed to the electrostatic chuck; and
   an RF strap coupling the peripheral RF feed to an RF source.

2. The chuck assembly of claim 1, wherein the plurality of facilities components coupled to the facility plate are enclosed within the first portion of the peripheral RF feed.

3. The chuck assembly of claim 1, wherein the first portion of the peripheral RF feed a sidewall assembly, the sidewall assembly extending substantially perpendicular from the facility plate.

4. The chuck assembly of claim 3, further comprising a second portion of the peripheral RF feed including an input plate, wherein the input plate is oriented substantially parallel to the facility plate and coupled to the first portion along a periphery of the input plate, the sidewall assembly electrically coupling the input plate and the facility plate.

5. The chuck assembly of claim 4, further comprising a mounting flange disposed substantially centrally in the input plate and wherein the RF strap is coupled to the mounting flange.

6. The chuck assembly of claim 3, wherein the sidewall assembly includes at least one opening and further comprising a cooling system supply facilities connection passing through the least one opening to the facility plate.

7. The chuck assembly of claim 1, further comprising a conducting component coupled to the facility plate and defined within an interior of the first portion of the hollow RF feed.

8. The chuck assembly of claim 1, further comprising a symmetrical, grounded shield substantially surrounding the peripheral RF feed.

9. The chuck assembly of claim 1, wherein the first portion of the hollow RF feed contacts the entire the periphery of the facility plate at a circumference defined on a side of the facility plate opposite the electrostatic chuck.

10. The chuck assembly of claim 9, wherein the circumference having a radius greater than one-half of a radius of the facility plate.

11. The chuck assembly of claim 1, wherein the first portion of the peripheral RF feed includes at least one opening for at least one facilities connection to the facility plate.

12. The chuck assembly of claim 1, wherein the plurality of facility components further includes a non-conductive lift pin system.

13. The chuck assembly of claim 1, wherein the plurality of facility components further includes a lift pin system that is electrically isolated from the hollow RF feed and the RF strap.

14. A chuck assembly for plasma processing, comprising:
    an electrostatic chuck having a substrate support surface on a first side;
    a facility plate coupled to the electrostatic chuck on a second side that is opposite the substrate support surface;
    a plurality of facility components coupled to the facility plate, the plurality of facility components including at least one of a group consisting of a heating component, a cooling component, a lift pin system component, a gas distribution component, at least one vacuum port, an instrumentation probe and/or an electrostatic clamping component;
    a peripheral RF feed configured to deliver RF power, the peripheral RF feed having a first portion contacting a substantial entirety of a periphery of the facility plate wherein the first portion of the hollow RF feed contacts the periphery of the facility plate at a circumference defined on a side of the facility plate opposite the electrostatic chuck wherein the first portion of the peripheral RF feed includes at least one opening for at least one facilities connection to the facility plate, the facility plate coupling the RF power from the peripheral RF feed to the electrostatic chuck;
    an RF strap coupling the peripheral RF feed to an RF source; and
    a substantially symmetrical, grounded shield surrounding the peripheral RF feed.

15. The chuck assembly of claim 14, wherein the plurality of facility components further includes a lift pin system that is electrically isolated from the hollow RF feed and the RF strap.

16. The chuck assembly of claim 14, wherein the first portion of the hollow RF feed contacts the entire periphery of the facility plate at a circumference defined on a side of the facility plate opposite the electrostatic chuck.

* * * * *